United States Patent [19]

Gilleo

[11] Patent Number: 4,747,968

[45] Date of Patent: May 31, 1988

[54] LOW TEMPERATURE CURE HAVING SINGLE COMPONENT CONDUCTIVE ADHESIVE

[75] Inventor: Kenneth B. Gilleo, Northfield, Minn.

[73] Assignee: Sheldahl, Inc., Northfield, Minn.

[21] Appl. No.: 9,146

[22] Filed: Jan. 28, 1987

Related U.S. Application Data

[63] Continuation of Ser. No. 731,867, May 8, 1985, abandoned, which is a continuation of Ser. No. 591,163, Mar. 19, 1984, abandoned.

[51] Int. Cl.$^4$ ................................................ A01B 1/04
[52] U.S. Cl. .................................... 252/514; 523/457; 523/459; 523/442; 528/90
[58] Field of Search ................ 252/514; 523/440, 442, 523/457, 458, 459; 528/90

[56] References Cited

U.S. PATENT DOCUMENTS

| | | | |
|---|---|---|---|
| 4,101,459 | 7/1978 | Andrews | 528/90 |
| 4,210,704 | 7/1980 | Chandross et al. | 252/514 |
| 4,407,674 | 10/1983 | Ehrreich | 252/514 |
| 4,410,457 | 10/1983 | Fujimura et al. | 252/514 |

*Primary Examiner*—Josephine Barr
*Attorney, Agent, or Firm*—Orrin M. Haugen; Thomas J. Nikolai

[57] ABSTRACT

An electrically conductive adherent film-forming adhesive which is rapidly curable thermally from a flowable liquid to an adherent and coherent solid at temperatures below about 120° C. and with a specific resistivity of less than about 0.001 ohm-cm. when cured, and comprising a uniform mixture with a formulation containing a liquid epoxy base resin, a hardening component for the epoxy resin consisting essentially of B·CF$_3$SO$_3$H, and silver metallic powder in an amount ranging from about 75% to 85%, with the powder having a substantial uniform particle size of less than about 20 microns (0.8 mil) in diameter.

4 Claims, No Drawings

LOW TEMPERATURE CURE HAVING SINGLE COMPONENT CONDUCTIVE ADHESIVE

This is a continuation of application Ser. No. 06/731,867, filed May 8, 1985, which was a continuation of parent application Ser. No. 06/591,163, filed Mar. 19, 1984, both now abandoned.

BACKGROUND OF THE INVENTION

The present invention relates generally to novel electrically conductive adherent and coherent film forming adhesives, and more particularly to such an electrically conductive film forming adhesive which rapidly cures from a flowable liquid state to an adherent and coherent solid state at modest temperatures such as temperatures below about 120° C. The conductive adhesive formulations of the present invention are particularly adapted for use in the direct bonding of various active or passive components to substrates having printed circuits thereon, particularly flexible printed circuits fabricated from heat sensitive substrates such as biaxially oriented polyethylene terephthalate.

In the past, adhesives, including conductive adhesives, have been widely employed in the bonding of electrical and electronic components to temperature sensitive substrates. Typically, such adhesives have been in the form of two-component systems which must be pre-mixed in precise ratios, and must be used within an extremely short period of time because of their limited pot life. Alternatively, single component conductive bonding systems have been proposed and have been available, however such systems are primarily intended for use with substrates capable of exposure to reasonably highly elevated temperatures, since such single component conductive bonding formulations have normally utilized relatively high curing temperatures. The present invention provides a single component system which eliminates the problems created by exposure to high temperatures, with the present system achieving a cure at temperatures below about 120° C., while requiring a cure-cycle of only a relatively few minutes.

Conductive bonding agents are in wide use in the bonding of electronic components, including both active and passive components such as transistors, diodes, light emitting diodes as well as other solid-state components, resistors, capacitors, and the like. For most production processes, it is desirable that the bonding agents undergo a cure cycle in the shortest possible interval of time. One of the most expeditious way of reducing cure time is, of course, the utilization of a higher curing temperature. Such an expedient is not available when dealing with temperature sensitive materials.

Substrates in wide use at the present time include, in particular, biaxially oriented polyethylene terephthalate. The temperature capability of stress oriented polyethylene terephthalate places a relatively low limit upon the temperature which may be employed during the cure cycle for the bonding agents employed, including conductive bonding agents. The limitations imposed upon these systems make it necessary to carefully control the temperatures involved in the cure cycle, as well as the mass of conductive bonding agent employed, bearing in mind that exothermic reactions frequently occur during the cure cycle. The combination of the elevated cure temperature, together with the terminal gain derived form the exothermic reaction, all contribute to the need to control the curing cycle, and furthermore contribute to time extension for the curing cycle involved.

A further consideration in the utilization of conductive bonding agents is the frequent requirement of surface pre-treatment for stress oriented polyethylene terephthalate. In order to provide utility for certain bonding agents, it has frequently been found necessary to treat the surface of stress oriented polyethylene terephthalate with a substance which will enhance the adhesion between the bonding agent and the surface of the film. In accordance with the formulations of the present invention, however, such surface pre-treatments are not required, and untreated surfaces of stress oriented polyethylene terephthalate establish acceptable bonds.

SUMMARY OF THE INVENTION

In accordance with the present invention, an electrically conductive adherent film forming adhesive formulation is provided which cures rapidly upon exposure to modestly elevated temperatures. The formulation may be prepared in single component form, and while flowable as a liquid, it is expeditiously curable to an adherent and coherent solid. The adhesive formulation comprises a substantially uniform mixture of a liquid epoxy base resin, together with a hardener or catalyst for the resin, along with a quantity of metallic silver flake and/or powder, with the silver particle having a substantially uniform particle size ranging from between about 1 micron and 20 microns. The formulation may be applied in extruded form from a container, such as a one-part dispenser, or applied with screen-printing or stencil-printing techniques. The adhesive, being electrically conductive, permits the direct bonding of electrical and electronic components to temperature sensitive circuits.

Epoxy resin is normally prepared as the reactant product of bisphenol A and epichlohydrin. Such epoxy resins are, of course, widely commercially available. The hardener or catalytic member for use in combination with the epoxy resin to form the adhesive formulations of the present invention are basic salts of trifluoromethane sulfonic acid, $CF_3SO_3H.B$. The metallic silver is utilized as a particle filler in the range of about 75% by weight, with the preferred silver particle having a granular size of about 5 microns. The resultant mixture provides a finished product having a specific volume resistivity of less than about 0.001 ohm-cm.

Therefore, it is a primary object of the present invention to provide an improved adhesive formulation which has substantial utility in the bonding of electrical and electronic components to temperature sensitive circuit components such as flexible substrates, with the adhesive being handled with conventional adhesive handling and application methods and techniques.

It is a further object of the present invention to provide an improved conductive bonding adhesive formulation which is useful in the bonding of electrical and electronic components including both active and passive components to temperature sensitive circuit elements such as flexible substrates of stress oriented polyethylene terephthalate.

It is yet a further object of the present invention to provide an improved adhesive which is capable of handling utilizing conventional adhesive application processes, methods and operations, and wherein the adhesive formulation may be handled as a one-component system curing rapidly at relatively low temperatures such as below about 120° C.

Other and further objects of the present invention will become apparent to those skilled in the art upon a study of the following specification and appended claims.

DESCRIPTION OF THE PREFERRED EMBODIMENT

In accordance with the preferred embodiment of the present invention, an electrically conductive adherent film-forming adhesive is prepared which comprises a uniform mixture with the following formulation:

| COMPONENT | PERCENT RANGE (WGT.) |
| --- | --- |
| (a) A liquid base epoxy resin selected from the group consisting of bisphenol A-diglycidyl ether diepoxide, cycloaliphatic diepoxide, epoxy novalacs, and other epoxies curable by strong Bronsted acids and containing a hardening component therein. | 24.9% to 14.9% by wt. total |
| (b) The hardening component consisting essentially of a base salt of trifluoromethane sulfonic acid $B.CF_3SO_3H$. | 1.0% to 4.0% by weight of epoxy resin |
| (c) Metallic silver flake and/or powder having a size of from between about 1 micron and 20 microns. | 75–85% by weight |

In preparing the formulation, the individual components are mixed so as to provide a uniform mixture, and an adhesive having a pot life of to about at least seven days at room temperature for the lowest temperature curing catalyst/epoxy blend.

In order to effect a cure for the formulation, the material, when subjected to modestly elevated temperatures such as a temperature of 120° C., will achieve a substantially full cure in approximately two to five minutes. The relatively rapid cure at only modestly elevated temperatures effects a substantial advantage for utilization of this material in most production operations.

The liquid epoxy base resin is selected from the group consisting of novolacs, bisphenol-A-diglycidyl ethers and cycloaliphatic epoxies. Such epoxy base resins are, of course, commercially available, with one such material being available from Dow Chemical Company of Midland, Mich., under the code name or designation "D.E.R. 332". A hardening component or catalyst for use in the present invention consists essentially of an amine salt of trifluoromethane sulfonic acid. This hardener may be employed in a ratio of between about 1% by weight of hardener per part of epoxy base resin, up to about 4% of hardener per part of epoxy base resin. The optimum curing cycle is obtained with a ratio of hardener to epoxy base resin of about 2% of hardener to resin. As is common, flexibilizers and diluents may be added to the epoxy base resin, in order to enhance the degree of flexibility of the cured product. Those materials which may be added to the formulation of the present invention include the polyols and aliphatic glycidylethers. Other flexibilizers may, in certain instances, be found to be usable.

While the term "base salt of trifluoromethane sulfonic acid" has been employed herein, it will be appreciated that this term is intended to refer to the amine salt of trifluoromethane sulfonic acid. Preferably, the tertiary amine salt, a formulation which is available commercially, may be employed, with this material having the structural formula as follows:

$$B.CF_3SO_3H$$

where "B" represents the radical NR'R"R'"H, and wherein "R', R", and R'''" each represent lower alkyl groups having up to 6 carbon atoms.

The silver metallic particles provide a means for achieving electrical and thermal conductivity in the adhesive layer. It has been found that the cured product retains its desirable adhesive and cohesive properties when silver flake/powder is provided in a range of up to about 80% by weight. With silver powder contained in lesser quantities, the adhesive and cohesive properties of the cured epoxy resin are, of course, preserved.

With respect to the metallic silver flake material, it has been found that when this material is incorporated in a quantity less than about 75% by weight, reasonable electrical conductivity is achieved, but normally above about 0.0001 ohm-cm.

For a typical production run wherein it is desired that semiconductor active components such as transistors be bonded to a film of stress oriented polyethylene terephthalate, the following formulation may be employed:

| COMPONENT | PERCENT RANGE (WGT.) |
| --- | --- |
| (a) A liquid base epoxy resin of bisphenol-A-dicylcidylether. | 18% |
| (b) The hardening component consists essentially of the amine salt of trifluoromethane sulfonic acid. | 2% |
| (c) Metallic silver powder having a diameter or cross-section of from between about 1 micron and 20 microns. | 80% |

Stress oriented polyethylene terephthalate films are, of course, widely commercially available, with one such product being available from E. I. DuPont de Nemours Corp. of Wilmington, Del. under the mark "MYLAR". Biaxially stress oriented polyethylene terephthalate films are available from other commercial sources as well.

CURE CYCLES

As indicated, a particular feature of the bonding materials of the present invention is the capability of achieving a rapid cure at relatively modestly elevated temperatures. It has been found that expeditious cure, such as in the range of about five minutes, may be achieved at temperatures in the range of no greater than about 120° C. Naturally, as the curing temperature is increased, more rapid cure cycles can be achieved. For most practical purposes, however, temperature sensitive components, such as stress oriented polyethylene terephthalate, should not be reasonably exposed to temperatures in excess of about 125° C. Other components present in the system may, of course, impose other temperature limitations on the cure cycle employed, it being understood, of course, that most electrical and electronic components and systems employed in combination with such components are capable of exposure to temperatures in the range of 120° C. without risking damage to the system.

What is claimed is:

1. An electrically conductive adherent film forming adhesive which is rapidly curable thermally from a flowable liquid form to an adherent and coherent solid at temperatures below about 120° C. and with a specific resistivity of less than about 0.001 ohm-cm. and comprising a uniform mixture with the following formulation:

| Component | Percent Range by Weight |
| --- | --- |
| (a) A liquid base epoxy resin selected from the group consisting of bisphenol A—diglycidyl ether diepoxide, gycloaliphatic diepoxide and epoxy novalacs, | 24.9% to 14.9% by weight total; |
| (b) A sole hardening component for said liquid epoxy base resin, said hardening component consisting essentially of the tertiary amine salt of trifluoromethane sulfonic acid having the structural formula B.CF$_3$SO$_3$H wherein "B" represents the radical NR'R"R"'H, and wherein "R'R", and R"" each represent lower alkyl groups having up to six carbon atoms and being free of other hardening components | 1.0% to 4.0% by weight of epoxy resin; |
| (c) Metallic silver | 75-85% by weight. |

2. The electrically conductive adherent film forming adhesive as defined in claim 1 being particularly characterized in that said adhesive has the following formulation:

| Component | Percent Range by Weight |
| --- | --- |
| (a) A liquid base epoxy resin of bisphenol A—diglycidyl ether | 18% |
| (b) The hardening component consists of the tertiary amine salt of trifluoromethane sulfonic acid having the structural formula B.CF$_3$SO$_3$H wherein "B" represents the radical NR'R"R"'H, and wherein "R'R", and R"" each represent lower alkyl groups having up to six carbon atoms | 2% |
| (c) Metallic silver powder having a cross-sectional diameter of from between about 1 micron and 20 microns having a size of from between about 1 micron and 20 microns | 80% |

3. The electrically conductive adherent film forming adhesive as defined in claim 1 being particularly characterized in that said metallic silver is in flake form.

4. The electrically conductive adherent film forming adhesive as defined in claim 1 being particularly characterized in that said metallic silver is in powder form.

* * * * *